(12) United States Patent
Takagi

(10) Patent No.: US 11,233,108 B2
(45) Date of Patent: Jan. 25, 2022

(54) DISPLAY DEVICE

(71) Applicant: Japan Display Inc., Minato-ku (JP)

(72) Inventor: Jun Takagi, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/844,007

(22) Filed: Apr. 9, 2020

(65) Prior Publication Data

US 2020/0235182 A1 Jul. 23, 2020

Related U.S. Application Data

(63) Continuation of application No. PCT/JP2018/037413, filed on Oct. 5, 2018.

(30) Foreign Application Priority Data

Oct. 12, 2017 (JP) .............................. JP2017-198601

(51) Int. Cl.
*H01L 27/32* (2006.01)
*H01L 51/50* (2006.01)

(52) U.S. Cl.
CPC ...... *H01L 27/3262* (2013.01); *H01L 27/3246* (2013.01); *H01L 51/5016* (2013.01)

(58) Field of Classification Search
CPC ............. H01L 27/3262; H01L 27/3246; H01L 51/5016
USPC ........................................................ 257/40
See application file for complete search history.

(56) References Cited

U.S. PATENT DOCUMENTS

| 2013/0306945 A1* | 11/2013 | Seo ..................... H01L 51/5072 257/40 |
| 2014/0034925 A1* | 2/2014 | Osaka ................. H01L 51/0067 257/40 |
| 2014/0034927 A1* | 2/2014 | Seo ..................... H01L 51/5206 257/40 |

(Continued)

FOREIGN PATENT DOCUMENTS

| JP | 2011-065800 A | 3/2011 |
| JP | 2013-116975 A | 6/2013 |

(Continued)

OTHER PUBLICATIONS

International Search Report dated Dec. 11, 2018 in PCT/JP2018/037413 filed on Oct. 5, 2018, citing documents AA-AC, AE & AQ therein, 2 pages.

(Continued)

*Primary Examiner* — Dzung Tran
(74) *Attorney, Agent, or Firm* — Oblon, McClelland, Maier & Neustadt, L.L.P.

(57) ABSTRACT

A display device according to an embodiment of the present invention includes: a substrate; a first organic light-emitting diode including a first lower electrode provided above the substrate and for each pixel, a first organic layer provided above the first lower electrode, a first light-emitting layer provided within the first organic layer and for each pixel and including a thermally activated material, and an upper electrode provided above the first organic layer; and a first drive TFT provided between the substrate and the first organic light-emitting diode, connected to the first lower electrode, and arranged overlapping the first light-emitting layer as viewed in a plan view.

5 Claims, 7 Drawing Sheets

(56) References Cited

U.S. PATENT DOCUMENTS

| | | |
|---|---|---|
| 2014/0034930 A1 | 2/2014 | Seo et al. |
| 2014/0034931 A1* | 2/2014 | Inoue .................. H01L 51/0085 257/40 |
| 2014/0061604 A1* | 3/2014 | Seo ..................... H01L 51/0085 257/40 |
| 2016/0172605 A1 | 6/2016 | Seo et al. |
| 2017/0133617 A1 | 5/2017 | Seo et al. |
| 2018/0226600 A1 | 8/2018 | Seo et al. |
| 2019/0067615 A1 | 2/2019 | Seo et al. |
| 2019/0267564 A1 | 8/2019 | Seo et al. |

FOREIGN PATENT DOCUMENTS

| | | |
|---|---|---|
| JP | 2014-45179 A | 3/2014 |
| JP | 2016-006906 A | 1/2016 |

OTHER PUBLICATIONS

Japanese Office Action dated Jul. 13, 2021 in Japanese Patent Application No. 2017-198601 (with English translation), citing document AO therein, 5 pages.

\* cited by examiner

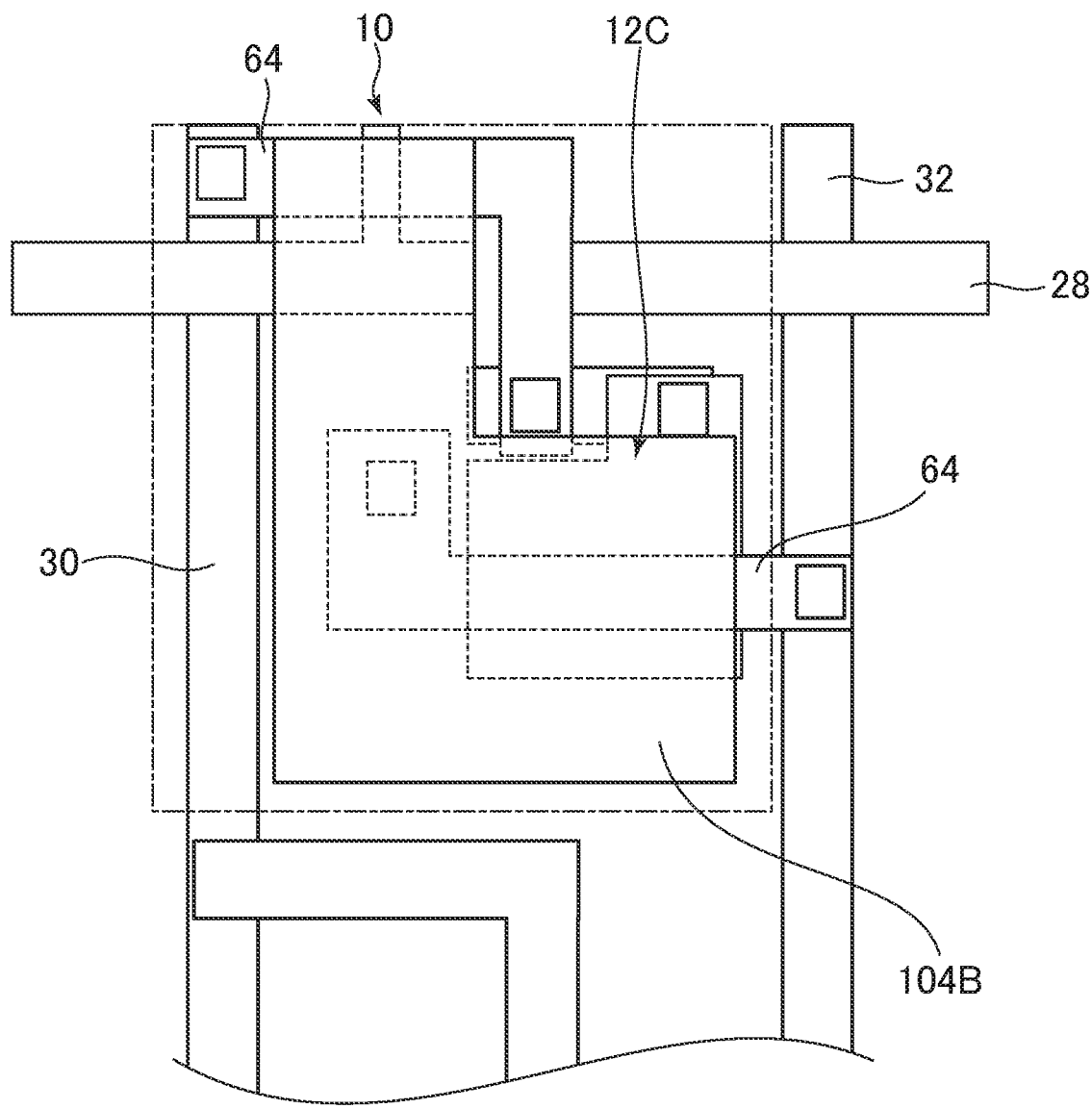

DISPLAY DEVICE

CROSS-REFERENCE TO RELATED APPLICATIONS

This application is a continuation under 35 U.S.C. 120 of International Application PCT/JP2018/037413 having the International Filing Date of Oct. 5, 2018, and having the benefit of the earlier filing date of Japanese Application No. 2017-198601, filed on Oct. 12, 2017. Each of the identified applications is fully incorporated herein by reference.

BACKGROUND OF THE INVENTION

1. Field of the Invention

One or more embodiments of the present invention relate to a display device.

2. Description of the Related Art

A flat-panel display such as an organic electroluminescence (EL) display device has a display panel having a substrate on which a thin-film transistor (TFT), an organic light-emitting diode (OLED) and the like are formed.

JP 2011-65800 A discloses a configuration having a plurality of organic light-emitting diodes and a bank arranged between the plurality of organic light-emitting diodes, which are arranged above an underlying structure layer including a substrate, a drive TFT, an interlayer insulating layer and the like. In JP 2011-65800 A, the drive TFT is arranged, overlapping the bank as viewed in a plan view but not overlapping the light-emitting layer included in the organic layer of the organic light-emitting diode.

JP 2013-116975 A discloses using a thermally activated delayed fluorescence (TADF) material for the light-emitting layer in the organic EL display device.

SUMMARY OF THE INVENTION

However, the related-art configurations have a problem in that a residual image phenomenon can occur. That is, in the related-art configurations, the residual image phenomenon can occur, when the light-emitting layer includes a thermally activated material but the absorption of thermal energy by the thermally activated material is insufficient.

One or more embodiments of the invention have been made in view of the foregoing problem, an object thereof is to suppress the occurrence of the residual image phenomenon in a display device having a light-emitting layer including a thermally activated material.

(1) A display device according to the disclosure includes: a substrate; a first organic light-emitting diode including a first lower electrode provided above the substrate and for each pixel, a first organic layer provided above the first lower electrode, a first light-emitting layer provided within the first organic layer and for each pixel and including a thermally activated material, and an upper electrode provided above the first organic layer; and a first drive TFT provided between the substrate and the first organic light-emitting diode, connected to the first lower electrode, and arranged overlapping the first light-emitting layer as viewed in a plan view.

(2) The display device according to the above-mentioned (1) may further include: a second organic light-emitting diode including a second lower electrode provided above the substrate and for each pixel, a second organic layer provided above the second lower electrode, a second light-emitting layer provided within the second organic layer and for each pixel and not including the thermally activated material, and the upper electrode provided above the second organic layer; and a second drive TFT provided between the substrate and the second organic light-emitting diode, connected to the second lower electrode, and arranged, not overlapping the second light-emitting layer as viewed in a plan view.

(3) The display device according to the above-mentioned (2) may further include an insulating film formed along a boundary of the pixel and having an opening in a light-emitting area of the pixel, wherein the second drive TFT is arranged overlapping the insulating film as viewed in a plan view.

(4) In the display device according to any one of the above-mentioned (1) to (3), the first light-emitting layer may include a thermally activated delayed fluorescence material as the thermally activated material.

(5) In the display device according to any one of the above-mentioned (1) to (4), a color of light emitted from the first light-emitting layer may be blue or green.

(6) In the display device according to the above-mentioned (2) or (3), a color of light emitted from the second light-emitting layer may be red.

BRIEF DESCRIPTION OF THE DRAWINGS

FIG. 7 is a schematic plan view showing the positional relationship between the light-emitting layer and the drive TFT included in the display device according to the embodiment.

DETAILED DESCRIPTION OF THE INVENTION

First Embodiment

An embodiment of the invention will now be described with reference to the drawings.

This disclosure is simply an example. Any suitable change that a person skilled in the art can easily think of without departing from the main idea of the invention should be included in the scope of the invention. In order to clarify the description, the drawings may schematically show each component in terms of width, thickness, shape and the like, compared with the actual form of the component. However, this is simply an example and should not limit the interpretation of the invention. In the description and the illustrations, a component similar to a component referred to in an already mentioned illustration is denoted by the same reference sign and may not be described further in detail.

Figure 1:
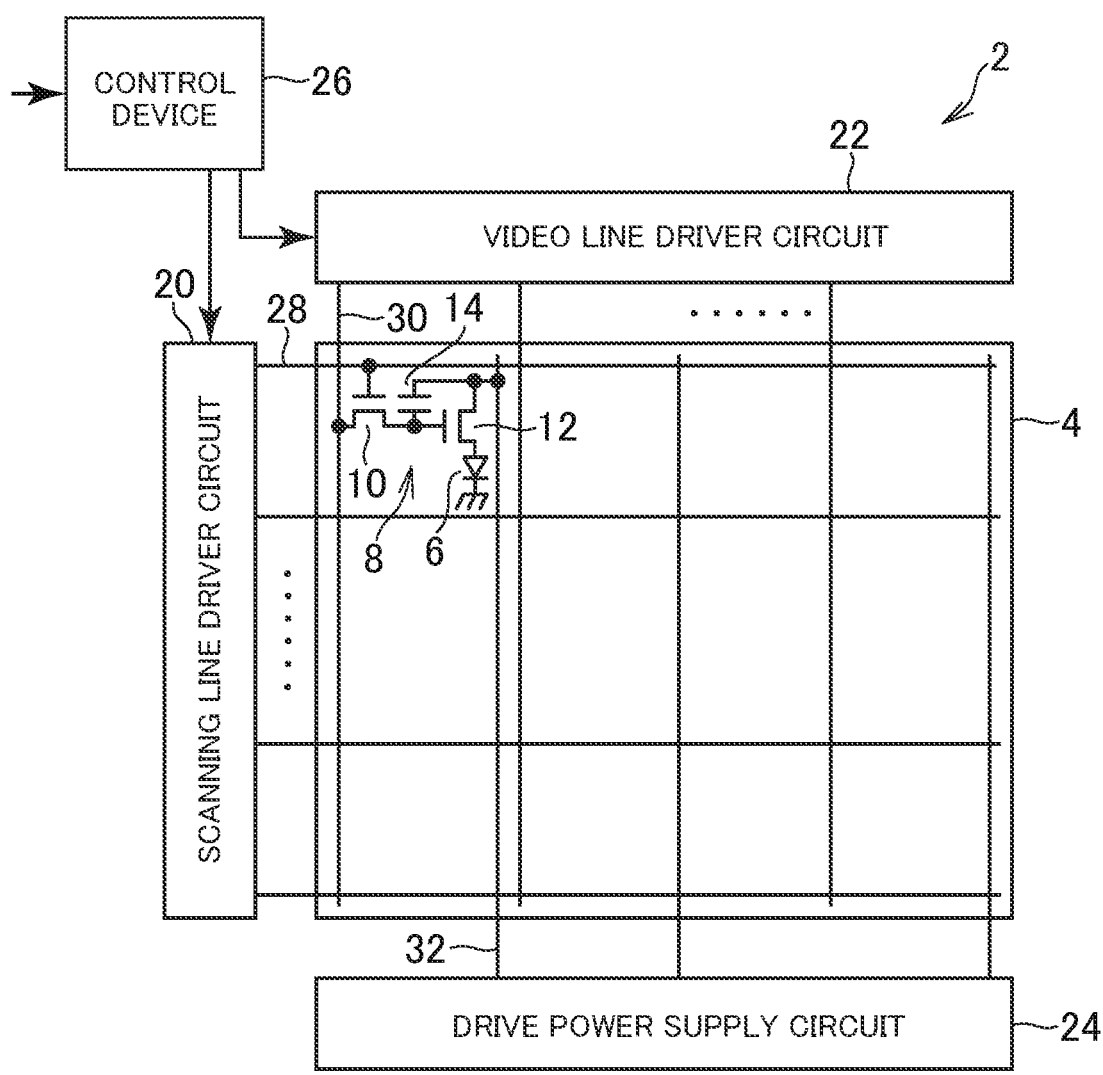
FIG. 1 is a schematic view showing a schematic configuration of a display device according to an embodiment.

A display device 2 according to this embodiment is, for example, an organic electroluminescence display device and installed in a television, personal computer, mobile terminal, mobile phone or the like. FIG. 1 is a schematic view showing a schematic configuration of the display device 2 according to this embodiment. The display device 2 has a pixel array unit 4 displaying an image, and a drive unit driving the pixel array unit 4. The display device 2 may have a base member formed of glass or the like. The display device 2 may be a flexible display. In such a case, the display device 2 may have a base member formed of a flexible resin film or the like. The display device 2 has a wiring layer including a wiring provided inside or above the base member.

In the pixel array unit 4, an organic light-emitting diode 6 and a pixel circuit 8 are arranged in the form of a matrix corresponding to each pixel. The pixel circuit 8 includes a lighting TFT (thin-film transistor) 10, a drive TFT 12, and a capacitor 14 or the like.

The drive unit includes a scanning line driver circuit 20, a video line driver circuit 22, a drive power supply circuit 24, and a control device 26. The drive unit drives the pixel circuit 8 and controls the light emission by the organic light-emitting diode 6.

The scanning line driver circuit 20 is connected to a scanning signal line 28 provided for each horizontal pixel array (pixel row). The scanning line driver circuit 20 sequentially selects the scanning signal line 28 in response to a timing signal input from the control device 26, and applies a voltage for turning on the lighting TFT 10, to the selected scanning signal line 28.

The video line driver circuit 22 is connected to a video signal line 30 provided for each vertical pixel array (pixel column). The video line driver circuit 22 receives a video signal from the control device 26. Based on the selection of the scanning signal line 28 by the scanning line driver circuit 20, the video line driver circuit 22 outputs a voltage corresponding to the video signal in the selected pixel row to each video signal line 30. This voltage is written into the capacitor 14 via the lighting TFT 10 at the selected pixel row. The drive TFT 12 supplies a current corresponding to the written voltage to the organic light-emitting diode 6. This causes the organic light-emitting diode 6 of the pixel corresponding to the selected scanning signal line 28 to emit light.

The drive power supply circuit 24 is connected to a drive power supply line 32 provided for each pixel column, and supplies a current to the organic light-emitting diode 6 via the drive power supply line 32 and the drive TFT 12 in the selected pixel row.

Here, a lower electrode of the organic light-emitting diode 6 is connected to the drive TFT 12. Meanwhile, an upper electrode of each organic light-emitting diode 6 is formed of an electrode common to the organic light-emitting diodes 6 of all the pixels. When the lower electrode is formed as the anode, a high electric potential is inputted to the lower electrode. In this case, the upper electrode is the cathode and a low electric potential is inputted to the upper electrode. When the lower electrode is formed as the cathode, a low electric potential is inputted to the lower electrode. In this case, the upper electrode is the anode and a high electric potential is inputted to the upper electrode.

Figure 2:
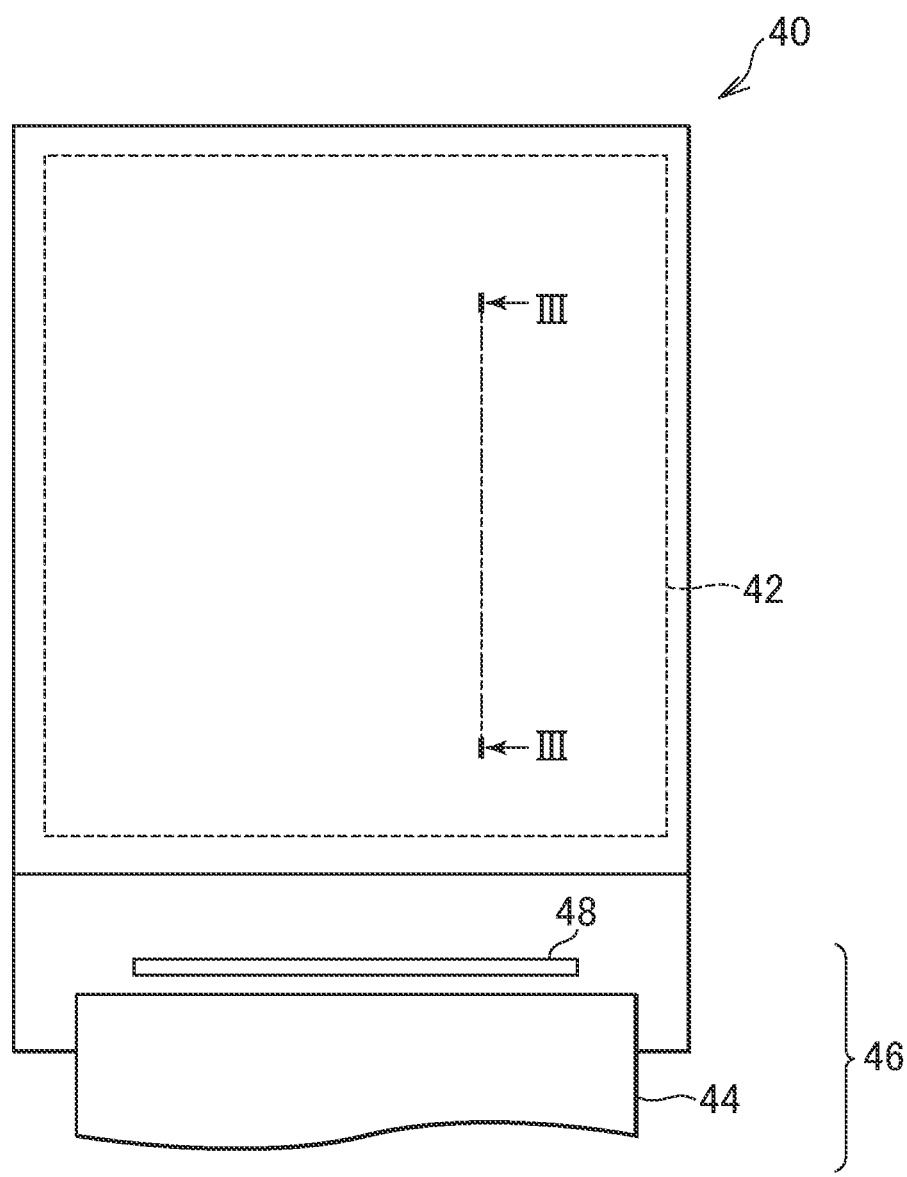
FIG. 2 is a schematic plan view showing a display panel in the display device according to the embodiment.

FIG. 2 is a schematic plan view showing a display panel 40 of the display device 2. In a display area 42 in the display panel 40, the pixel array unit 4 shown in FIG. 1 is provided and the organic light-emitting diode 6 is arrayed in the pixel array unit 4, as described above.

In the display panel 40, a drive unit forming area 46 is provided outside the display area 42 and a wiring connected to the display area 42 is arranged. In the drive unit forming area 46, a driver IC 48 forming the drive unit is installed and an FPC (flexible printed circuit) 44 is connected thereto. The FPC 44 is connected to the scanning line driver circuit 20, the video line driver circuit 22, the drive power supply circuit 24, and the control device 26 and the like, or has an IC installed on the FPC 44.

Figure 3:
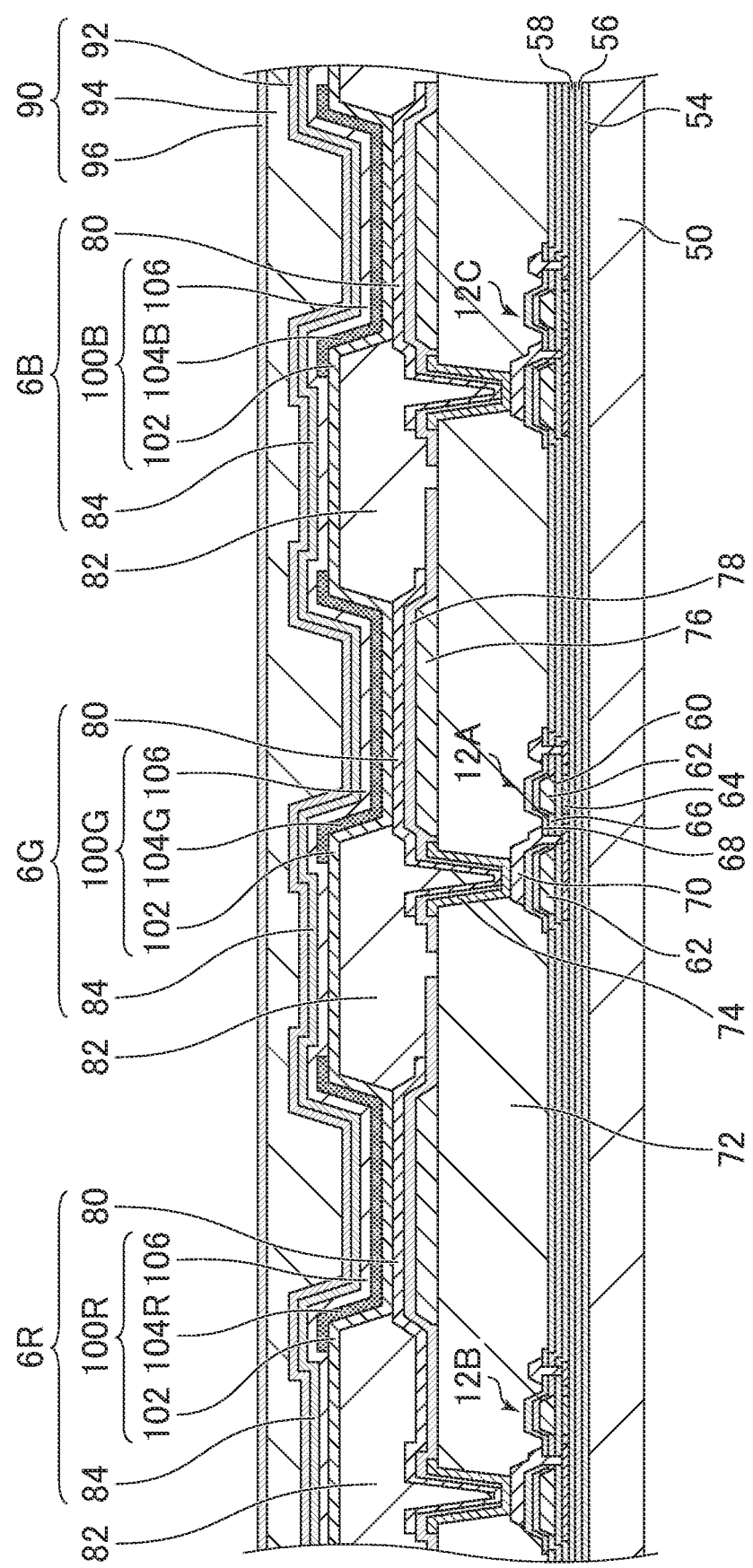
FIG. 3 is a schematic vertical cross-sectional view showing the display panel, taken along in FIG. 2.

Example 1 in this embodiment will now be described with reference to FIG. 3. FIG. 3 is a schematic vertical cross-sectional view showing the display panel 40, taken along shown in FIG. 2.

As shown in FIG. 3, the display panel 40 in this embodiment has an array substrate 50. In this embodiment, polyimide is used as the material forming the array substrate 50. The array substrate may be a base member formed of glass or the like. In the case of a flexible display, any other resin material than polyimide that is a sufficiently flexible base material may be used as the material forming the array substrate 50.

A three-layer structure including a first silicon oxide film 54, a first silicon nitride film 56, and a second silicon oxide film 58 is provided as an undercoat layer above the array substrate 50. The first silicon oxide film 54, which is the lowermost layer, is provided to improve contactability with the array substrate 50. The first silicon nitride film 56, which is the middle layer, is provided as a blocking film against moisture and impurities from outside. The second silicon oxide film 58, which is the uppermost layer, is provided as a blocking film preventing hydrogen atoms contained in the first silicon nitride film 56 from spreading toward a semiconductor layer. However, the undercoat layer is not particularly limited to this structure and may have a structure having still another layer, or a single-layer structure or two-layer structure.

A first drive TFT 12A, a second drive TFT 12B, and a third drive TFT 12C are provided above the undercoat layer. Each drive TFT 12 has a structure in which a low-concentration impurity area is provided between a channel area and a source/drain area. In this embodiment, a silicon oxide film is used as a gate insulating film 60, and a first wiring 62 formed of a multilayer structure of Ti and Al is used as a gate electrode. The first wiring 62 also functions as a retention capacitance line in addition to functioning as the gate electrode of the drive TFT 12. That is, the first wiring 62 is used to form a retention capacitance with a polysilicon film 64.

A second silicon nitride film 66 and a third silicon oxide film 68, forming an interlayer insulating film, are stacked above the drive TFT 12. Also, a second wiring 70 forming a source/drain electrode and a routing wiring is formed. In this embodiment, the second wiring 70 has a three-layer structure of Ti, Al, and Ti. The interlayer insulating film, an electrode formed of an electrically conductive layer in the same layer as the first wiring 62, and an electrode formed of an electrically conductive layer in the same layer as the source/drain wiring of the drive TFT 12, together form a retention capacitance. The routing wiring is extended to an end at a peripheral edge of the array substrate 50 and forms a terminal connecting the FPC 44 and the driver IC 48 shown in FIG. 2.

A planarizing film 72 is formed above the drive TFT 12. As the planarizing film 72, an organic material such as a photosensitive acrylic material is often used. The planarizing film 72 has a higher surface planarity than an inorganic insulating material formed by a CVD (chemical vapor deposition) method or the like. The planarizing film 72 is removed at a pixel contact part and a peripheral area. An upper surface of the second wiring 70 exposed by the removal of the planarizing film 72 is covered by a transparent conductive film 74 made of ITO (indium tin oxide).

Subsequently, a third wiring 76 is provided in the same layer as the transparent conductive film 74. In this embodiment, the third wiring 76 has a three-layer structure of Mo, Al, and Mo, and is used to form a peripheral routing wiring and a capacitance element additionally provided within a pixel. The transparent conductive film 74 covering the upper surface of the second wiring 70 exposed after removing the planarizing film 72, as described above, also serves to protect the exposed surface of the second wiring 70 from a patterning process for the third wiring 76. An upper surface of the transparent conductive film 74 and of the third wiring 76 is temporarily covered by a third silicon nitride film 78. Subsequently, at a pixel contact part of the transparent conductive film 74, an opening is provided in the third silicon nitride film 78 and a part of the upper surface of the transparent conductive film 74 is exposed.

Subsequently, a lower electrode 80 to be a pixel electrode is formed in such a way as to be connected to the upper surface of the transparent conductive film 74 exposed from the opening. In this embodiment, the lower electrode 80 is formed as a reflective electrode and has a three-layer structure of ITO, Ag, and ITO. At the pixel contact part, the transparent conductive film 74, the third silicon nitride film 78, and the lower electrode 80 form an additional capacitance. At the time of patterning the lower electrode 80, a part of the transparent conductive film 74 is exposed to an etching environment. However, due to annealing after the process of forming the transparent conductive film 74 and before the process of forming the lower electrode 80, the transparent conductive film 74 is resistant to the etching of the lower electrode 80.

After the process of forming the lower electrode 80, an insulating film 82 to be a partition of the pixel area, called bank or rib, is formed. As the insulating film 82, a photosensitive acrylic material or the like is used, as in the case of the planarizing film 72. Preferably, the insulating film 82 is opened to expose the upper surface of the lower electrode 80 as a light-emitting area and its opening edge is gently tapered. If the opening edge is steeply shaped, it causes coverage failure in an organic layer 100 to be formed later. The planarizing film 72 and the insulating film 82 have a site where these films come into contact with each other via the opening provided in the third silicon nitride film 78 present between the two films. This opening is provided to extract, through the insulating film 82, moisture and gas released from the planarizing film 72 during heat treatment or the like after the process of forming the insulating film 82.

After the insulating film 82 is formed, an organic material forming the organic layer 100 is formed in a multilayer structure. As the multilayer structure forming the organic layer 100, a hole transport layer 102, a light-emitting layer 104, and an electron transport layer 106 are stacked in order from the lower electrode 80 side. In this embodiment, the hole transport layer 102 and the electron transport layer 106 are formed over a plurality of sub-pixels, and the light-emitting layer 104 is formed at each sub-pixel. The organic layer 100 may be formed by vapor deposition or may be formed by coating with solvent dispersion. The organic layer 100 may also be selectively formed at each sub-pixel or may be formed as a layer over an entire surface covering the display area 42. When the organic layer 100 is formed as a layer, a configuration that acquires white light at all the sub-pixels and extracts a component of a desired color wavelength via a color filter (not illustrated) can be provided. In this embodiment, a configuration in which the organic layer 100 is selectively formed at each sub-pixel is employed.

After the organic layer 100 is formed, an upper electrode 84 is formed. In this embodiment, since a top-emission structure is employed, the upper electrode 84 is formed using a transparent conductive material, for example, IZO (indium zinc oxide). According to the order of forming the organic layer 100, the lower electrode 80 is the anode and the upper electrode 84 is the cathode.

The upper electrode 84, the organic layer 100, and the lower electrode 80 together form the organic light-emitting diode 6. In this embodiment, the display device 2 has a first organic light-emitting diode 6G in which a first light-emitting layer 104G emitting green light is included in its first organic layer 100G, a second organic light-emitting diode 6R in which a second light-emitting layer 104R emitting red light is included in its second organic layer 100R, and a third organic light-emitting diode 6B in which a third light-emitting layer 104B emitting blue light is included in its third organic layer 100B.

In this embodiment, the first light-emitting layer 104G emitting green light and the third light-emitting layer 104B emitting blue light include a thermally activated material, specifically, a thermally activated delayed fluorescence material as an assistant dopant. The second light-emitting layer 104R emitting red light is a light-emitting layer 104 not including a thermally activated material. The second organic light-emitting diode 6R including the second light-emitting layer 104R is a phosphorescent element.

As disclosed in JP 2013-116975 A and the like, in the case of a carrier-injected organic EL element, normally, 25° of generated excitons are excited into a singlet excited state and the other 75% are excited into a triplet excited state. Therefore, using the phosphorescence that is the light emitted from the triplet excited state achieves a higher energy utilization efficiency. However, since the triplet excited state has a longer life, the deactivation of energy occurs due to the saturation of the excited state and the interaction with the exciton in the triplet excited state. Therefore, in many cases, the quantum yield of phosphorescence is generally not high.

Meanwhile, as for the delayed fluorescence material, after energy shifted into a triplet excited state due to intersystem crossing or the like, inverse intersystem crossing into a singlet excited state occurs due to triplet-triplet annihilation or absorption of heat energy, and the delayed fluorescence material radiates fluorescence. When the delayed fluorescence material is used for the organic EL element, the exciton in the singlet excited state radiates fluorescence as usual. However, the exciton in the triplet excited state absorbs heat, becomes subject to intersystem crossing into the singlet excited state, and radiates fluorescence. At this time, light which has the same wavelength as the fluorescence, that is, the light emitted from the singlet excited state, but which is generated due to the inverse intersystem crossing from the triplet exited state to the singlet excited state, has a longer life than normal fluorescence or phosphorescence and therefore is observed as fluorescence delayed from these. This can be defined as delayed fluorescence.

Using such a thermally activated exciton migration mechanism makes it possible to increase the proportion of the compound in the singlet excited state from the normal proportion of 25% to higher than 25% by absorbing the heat energy after injecting the carrier.

The lower electrode 80 in the first organic light-emitting diode 6G is connected to the first drive TFT 12A. The lower electrode 80 in the second organic light-emitting diode 6R is connected to the second drive TFT 12B. The lower electrode 80 in the third organic light-emitting diode 6B is connected to the third drive TFT 12C.

Figure 4:
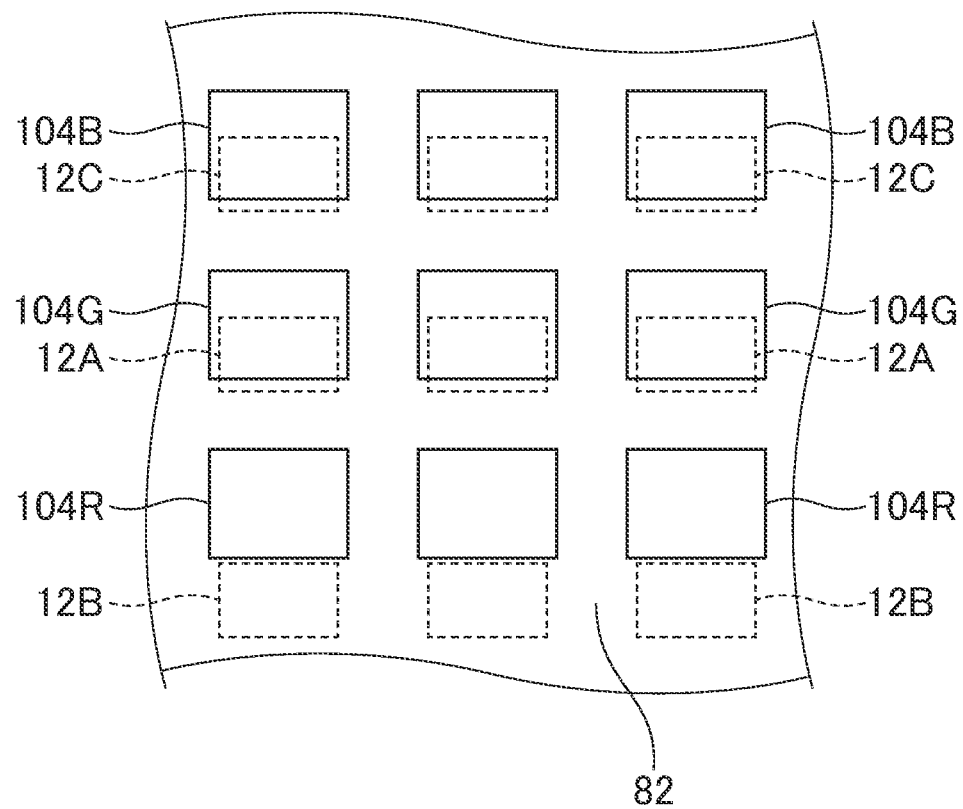
FIG. 4 is a schematic plan view showing the positional relationship between a light-emitting layer and a drive TFT included in the display device according to the embodiment.
Figure 5:
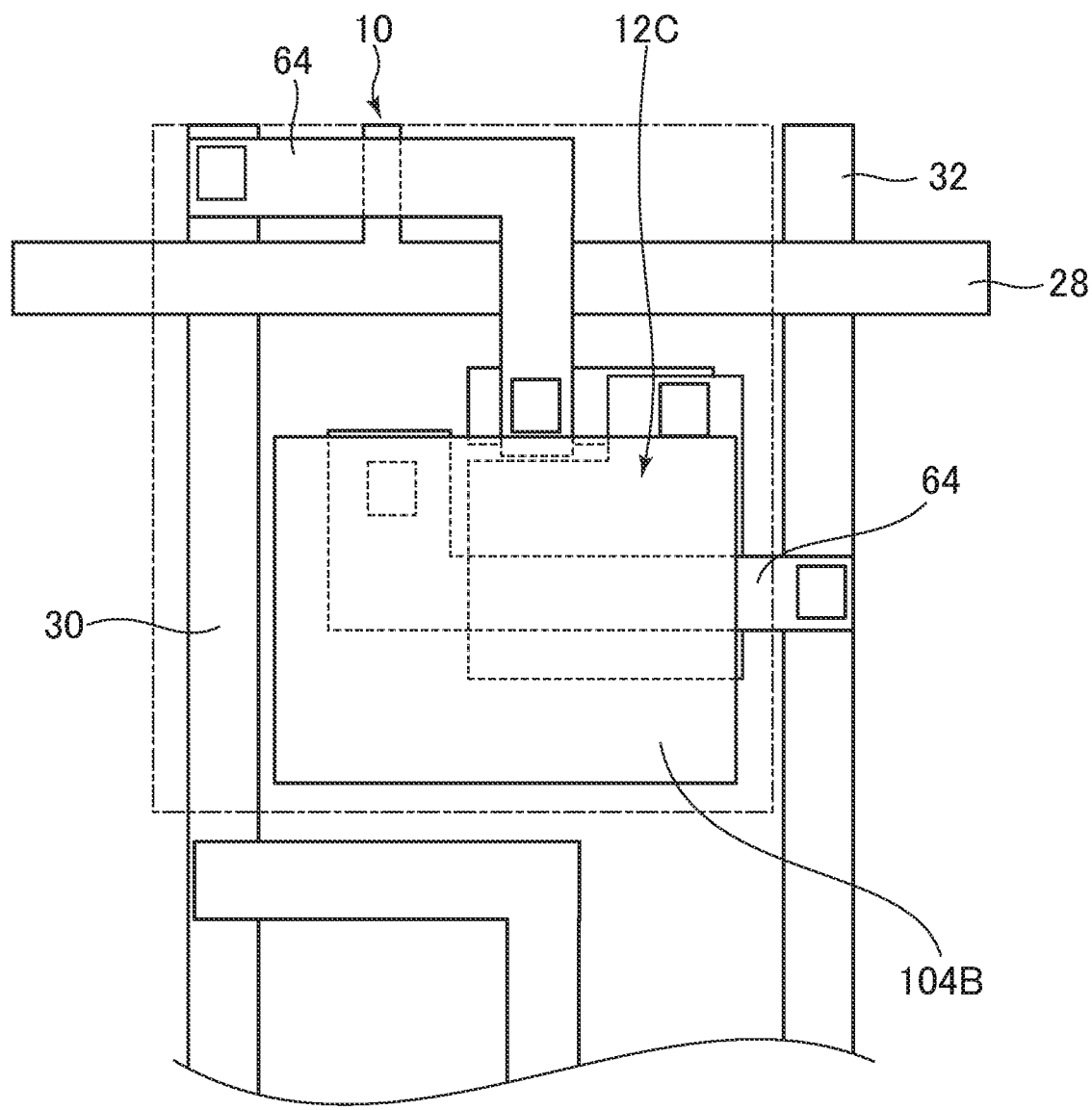
FIG. 5 is a schematic plan view showing the positional relationship between the light-emitting layer and the drive TFT included in the display device according to the embodiment.

In this embodiment, the first light-emitting layer 104G including the thermally activated material is arranged overlapping the first drive TFT 12A as viewed in a plan view, as shown in FIG. 3 and in FIGS. 4 and 5, which are schematic plan views showing the positional relationship between the light-emitting layer 104 and the drive TFT 12. The third light-emitting layer 104B including the thermally activated material is arranged, at least partly overlapping the third drive TFT 12C as viewed in a plan view. FIG. 5 shows the positional relationship in a pixel including the third light-emitting layer 104B including the thermally activated material shown in FIG. 3. A chain-dotted line in FIGS. 5 and 6 represents a unit of repetition of pixel.

Such a configuration enables the thermally activated delayed fluorescence material included in the first light-emitting layer 104G to efficiently absorb the heat energy of the first drive TFT 12A and can facilitate the inverse intersystem crossing of the delayed fluorescence material included in the first light-emitting layer 104G into the singlet excited state. Similarly, this configuration enables the thermally activated delayed fluorescence material included in the third light-emitting layer 104B to efficiently absorb the heat energy of the third drive TFT 12C and can facilitate the inverse intersystem crossing of the delayed fluorescence material included in the third light-emitting layer 104B into the singlet excited state. The arrangement position of the third light-emitting layer 104B may overlap one or more TFTs (lighting TFT 10 and driver TFT 12), as shown in FIG. 7. A chain-dotted line in FIG. 7 represents a unit of repetition of pixel.

Figure 6:
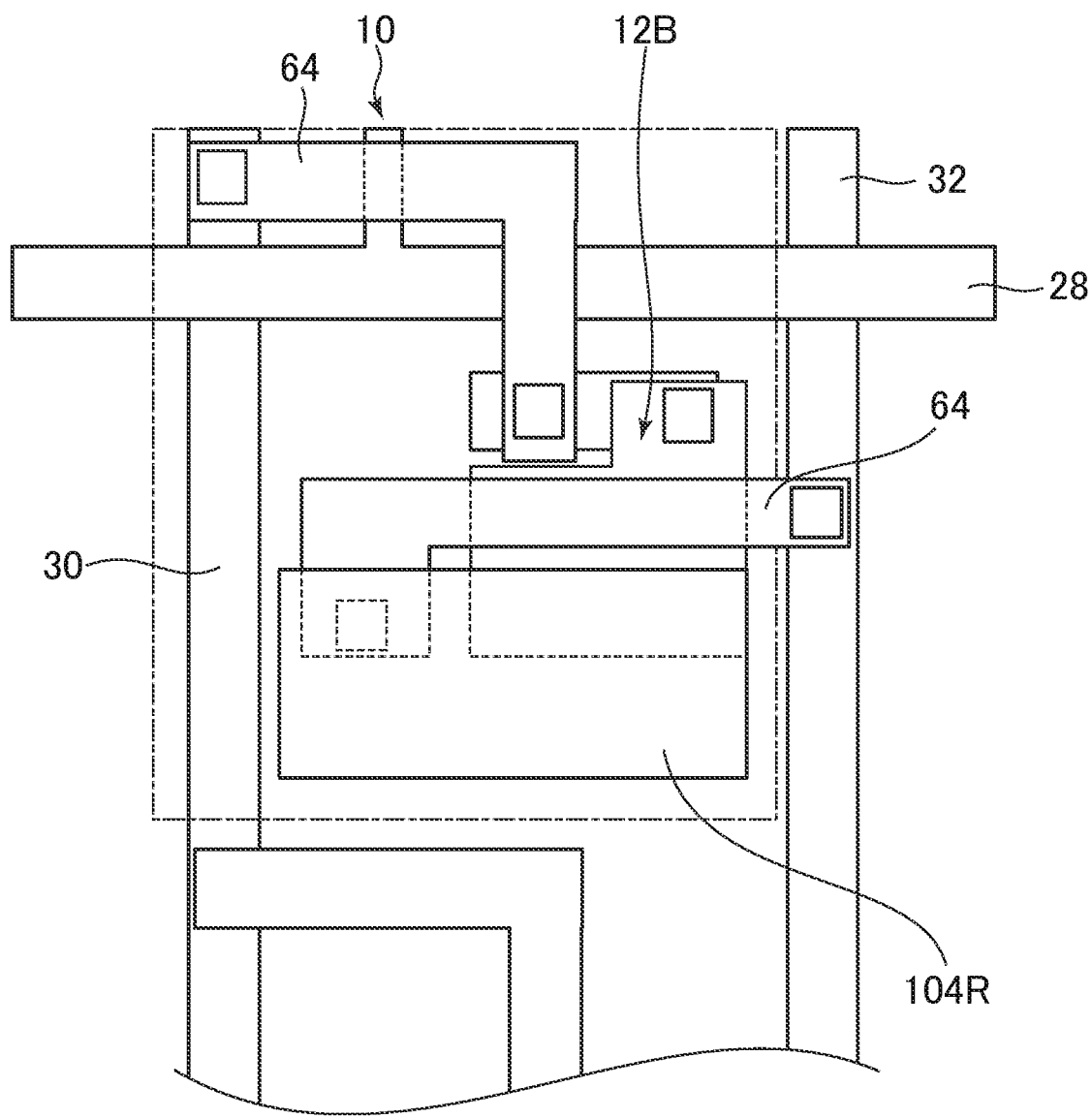
FIG. 6 is a schematic plan view showing the positional relationship between the light-emitting layer and the drive TFT included in the display device according to the embodiment.

In this embodiment, the second light-emitting layer 104R in the second organic light-emitting diode 6R, which is a phosphorescent element not including a thermally activated material, is arranged, not overlapping the second drive TFT 12B as viewed in a plan view, as shown in FIGS. 3, 4, and 6. Specifically, the second drive TFT 12B is arranged overlapping the insulating film 82 arranged near the second light-emitting layer 104R, as viewed in a plan view. FIG. 6 shows the positional relationship in a pixel including the second light-emitting layer 104R not including a thermally activated material shown in FIG. 3. A chain-dotted line in FIG. 6 represents a unit of repetition of pixel.

Such a configuration can suppress the transfer of the heat energy of the second drive TFT 12B to the second light-emitting layer 104R in the second organic light-emitting diode 6R, which is a phosphorescent element not including a thermally activated material, and can suppress a reduction in the life of the second organic light-emitting diode 6R, which is a phosphorescent element.

After the upper electrode 84 is formed, a passivation layer 90 is formed. One of the functions of the passivation layer 90 is to prevent entry of moisture from outside into the organic layer 100, which is already formed. Therefore, the passivation layer 90 needs to have a high gas barrier capability. In this embodiment, a multilayer structure formed of a fourth silicon nitride film 92, an organic resin film 94 made of an acrylic resin or the like, and a fifth silicon nitride film 96 is employed as the multilayer structure of the passivation layer 90. Also, a silicon oxide film may be provided between the organic resin film 94 and the fifth silicon nitride film 96.

The foregoing process prepares the display device 2. A glass cover, a touch panel substrate and the like may be provided above the passivation layer 90, according to need. In this case, a filler including a resin or the like may be provided between the display device 2, and the glass cover, the touch panel substrate and the like in order to fill the gap between them.

A person skilled in the art can think of various alteration examples and modification examples without departing from the idea of the invention. Such alteration examples and modification examples are understood to belong to the scope of the invention. For example, suitable addition, deletion or design change of a component, or addition, omission or condition change of a process, made to the embodiment by a person skilled in the art, is included in the scope of the invention, provided that it has the main idea of the invention.

What is claimed is:

1. A display device comprising:
   a substrate;
   a first organic light-emitting diode including a first lower electrode provided above the substrate and for a first color, a first organic layer provided above the first lower electrode, a first light-emitting layer provided within the first organic layer and including a thermally activated material, and an upper electrode provided above the first organic layer;
   a first drive TFT provided between the substrate and the first organic light-emitting diode, connected to the first lower electrode, and arranged overlapping the first light-emitting layer as viewed in a plan view,
   a second organic light-emitting diode including a second lower electrode provided above the substrate and for a second color, a second organic layer provided above the second lower electrode, a second light-emitting layer provided within the second organic layer and not including the thermally activated material, and the upper electrode provided above the second organic layer; and
   a second drive TFT provided between the substrate and the second organic light-emitting diode, connected to the second lower electrode, and arranged, not overlapping the second light-emitting layer as viewed in a plan view.

2. The display device according to claim 1, further comprising:
   an insulating film formed along a boundary of the first organic layer and having an opening in a light-emitting area of the first organic layer, wherein
   the second drive TFT is arranged overlapping the insulating film as viewed in a plan view.

3. The display device according to claim 1, wherein
   the first light-emitting layer includes a thermally activated delayed fluorescence material as the thermally activated material.

4. The display device according to claim 1, wherein
   a color of light emitted from the first light-emitting layer is blue or green.

5. The display device according to claim 1, wherein
   a color of light emitted from the second light-emitting layer is red.

\* \* \* \* \*